United States Patent
Nakamura et al.

(10) Patent No.: US 10,520,162 B2
(45) Date of Patent: Dec. 31, 2019

(54) ILLUMINATION DEVICE

(71) Applicant: FUJIFILM Corporation, Tokyo (JP)

(72) Inventors: Samito Nakamura, Tokyo (JP);
Hiromi Takenoshita, Tokyo (JP);
Daisaku Abiru, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/950,494

(22) Filed: Apr. 11, 2018

(65) Prior Publication Data

US 2018/0231210 A1 Aug. 16, 2018

Related U.S. Application Data

(63) Continuation of application No. PCT/JP2016/080303, filed on Oct. 13, 2016.

(30) Foreign Application Priority Data

Oct. 16, 2015 (JP) .................. 2015-204455

(51) Int. Cl.
*F21S 43/14* (2018.01)
*F21S 43/20* (2018.01)
(Continued)

(52) U.S. Cl.
CPC .............. *F21V 5/048* (2013.01); *F21S 43/14* (2018.01); *F21S 43/26* (2018.01); *F21V 5/004* (2013.01);
(Continued)

(58) Field of Classification Search
CPC ........ F21V 5/008; G02B 3/0062; F21S 43/26; F21S 41/255
See application file for complete search history.

(56) References Cited

U.S. PATENT DOCUMENTS 3,213,753 A * 10/1965 Rogers .................. F21S 41/135
359/489.16
RE26,506 E * 12/1968 Rogers ................ G02B 5/3025
359/489.07
(Continued)

FOREIGN PATENT DOCUMENTS

| JP | H06-068208 U | 9/1994 |
| JP | 2014-207245 A | 10/2014 |
| WO | 2012/147653 A1 | 11/2012 |

OTHER PUBLICATIONS

International Search Report issued in PCT/JP2016/080303; dated Jan. 10, 2017.
(Continued)

*Primary Examiner* — Alexander K Garlen
*Assistant Examiner* — Eric T Eide
(74) *Attorney, Agent, or Firm* — Studebaker & Brackett PC (57) ABSTRACT

Provided is a high-decorativeness illumination device that utilizes lenticular lens sheets. An illumination device includes first to third lenticular lens sheets, an LED light source, and a casing. The first and second lenticular lens sheets are laminated such that an angle formed by plano-convex cylindrical lenses falls within a first angle range which is greater than 0 degrees and is less than 30 degrees. Accordingly, moire fringes appear in illumination light rays. The third lenticular lens sheet is laminated on the first and second lenticular lens sheets such that angles formed by plano-convex cylindrical lenses fall within a second angle range which is equal to or greater than 30 degrees and is equal to or less than 90 degrees.

11 Claims, 13 Drawing Sheets

(51) Int. Cl.
*F21V 5/04* (2006.01)
*F21V 5/00* (2018.01)
*G02B 3/00* (2006.01)
*G02B 5/02* (2006.01)
*F21Y 115/10* (2016.01)
*G02B 27/60* (2006.01)
*H01L 33/58* (2010.01)
*G02B 19/00* (2006.01)

(52) U.S. Cl.
CPC .............. *F21V 5/008* (2013.01); *G02B 3/005* (2013.01); *G02B 3/0062* (2013.01); *G02B 5/0215* (2013.01); *G02B 5/0278* (2013.01); *F21Y 2115/10* (2016.08); *G02B 19/0014* (2013.01); *G02B 19/0061* (2013.01); *G02B 27/60* (2013.01); *H01L 33/58* (2013.01)

(56) References Cited

U.S. PATENT DOCUMENTS

| | | | |
|---|---|---|---|
| 5,598,280 A * | 1/1997 | Nishio | F21V 5/04 349/57 |
| 7,186,004 B2 * | 3/2007 | Powell | G02B 3/0025 359/365 |
| 8,023,193 B2 * | 9/2011 | Chen | G02B 27/2214 359/621 |
| 2005/0099814 A1 * | 5/2005 | Kohno | G03F 7/70075 362/268 |
| 2011/0026240 A1 * | 2/2011 | Hayashi | G02B 6/0065 362/97.1 |
| 2011/0026248 A1 * | 2/2011 | Stollwerck | G02F 1/133604 362/235 |
| 2013/0135856 A1 * | 5/2013 | Arai | F21S 10/02 362/231 |
| 2015/0153018 A1 * | 6/2015 | Lin | F21V 7/0033 362/259 |

OTHER PUBLICATIONS

International Preliminary Report on Patentability issued in PCT/JP2016/080303; dated Oct. 23, 2017.

* cited by examiner

ILLUMINATION DEVICE

CROSS-REFERENCE TO RELATED APPLICATIONS

This application is a Continuation of PCT International Application No. PCT/JP2016/080303 filed on 13 Oct. 2016, which claims priority under 35 U.S.C § 119(a) to Japanese Patent Application No. 2015-204455 filed on 16 Oct. 2015. The above application is hereby expressly incorporated by reference, in its entirety, into the present application.

BACKGROUND OF THE INVENTION

1. Field of the Invention

The present invention relates to an illumination device that illuminates an inside of a room in which a lenticular lens sheet is used.

2. Description of the Related Art

An illumination device using a point light source such as a light emitting diode (LED) with high luminance and with low power consumption has come into wide use instead of an illumination device using an incandescent light bulb or a fluorescent lamp of the related art. For example, an illumination device described in WO2012/147653A includes a plurality of LEDs arranged in a straight-line shape on a substrate and a diffusion sheet arranged so as to cover the LEDs on a front surface thereof. The diffusion sheet is a lenticular lens sheet in which a plurality of plano-convex cylindrical lenses is arranged in parallel, and diffuses and transmits light rays emitted from the LEDs.

SUMMARY OF THE INVENTION

In the illumination device described in WO2012/147653A, the lenticular lens sheet is used only for diffusing the light in an arrangement direction of the plurality of LEDs and a direction which is substantially perpendicular to the arrangement direction. Thus, only monotonous illumination light rays (diffusion light rays) which are emitted from the plurality of LEDs and are transmitted through the lenticular lens sheet are emitted from the illumination device described in WO2012/147653A. As stated above, there are problems that the illumination device described in WO2012/147653A is an illumination device that does not sufficiently use the lenticular lens sheet and is simply used for diffusing the light and lacks decorativeness.

An object of the present invention is to provide a high-decorativeness illumination device using the lenticular lens sheet.

An illumination device of the present invention comprises a first lenticular lens sheet, a second lenticular lens sheet, a third lenticular lens sheet, and at least one point light source. The second lenticular lens sheet is laminated on the first lenticular lens sheet such that an angle formed by the first direction and the second direction falls within a first angle range. The third lenticular lens sheet is laminated on the first and second lenticular lens sheets such that each of an angle formed by the first direction and the third direction and an angle formed by the second direction and the third direction falls within a second angle range. A lower limit of the second angle range is greater than an upper limit of the first angle range. In the first lenticular lens sheet, a plurality of first plano-convex cylindrical lenses which extends in a first direction is arranged in a direction perpendicular to the first direction. In the second lenticular lens sheet, a plurality of second plano-convex cylindrical lenses which extends in a second direction is arranged in a direction perpendicular to the second direction. In the third lenticular lens sheet, a plurality of third plano-convex cylindrical lenses which extends in a third direction is arranged in a direction perpendicular to the third direction. The point light source emits illumination light rays through the first to third lenticular lens sheets.

It is preferable that the first angle range is an angle range in which rotation moire appears by the first and second lenticular lens sheets. It is preferable that the first angle range is a range which is greater than 0 degrees and is less than 30 degrees. It is preferable that the first and second lenticular lens sheets are laminated in contact with each other and the third lenticular lens sheet is arranged on a side of the first and second lenticular lens sheets facing the point light source or on a side of the first and second lenticular lens sheets opposite to the point light source.

It is preferable that the first and second lenticular lens sheets are laminated such that flat surfaces are in contact with each other. It is preferable that the second lenticular lens sheet is held so as to rotate around the first lenticular lens sheet.

It is preferable that the illumination device further comprises a support member that supports the point light source and the first to third lenticular lens sheets. It is preferable that the support member has a cylindrical shape and the point light source is arranged on a central axis of the support member.

It is preferable that the first to third lenticular lens sheets have circular shapes and in a case where a diameter of the circle is D and arrangement pitches of the first and second plano-convex cylindrical lenses are P, a lower limit of the first angle range is αmin calculated by αmin=a tan(P/D). It is preferable that color of the point light source is variable. It is preferable that the point light source is an LED light source.

According to the present invention, it is possible to provide a high-decorativeness illumination device using the lenticular lens sheet.

DESCRIPTION OF THE PREFERRED EMBODIMENTS

First Embodiment

Figure 1:
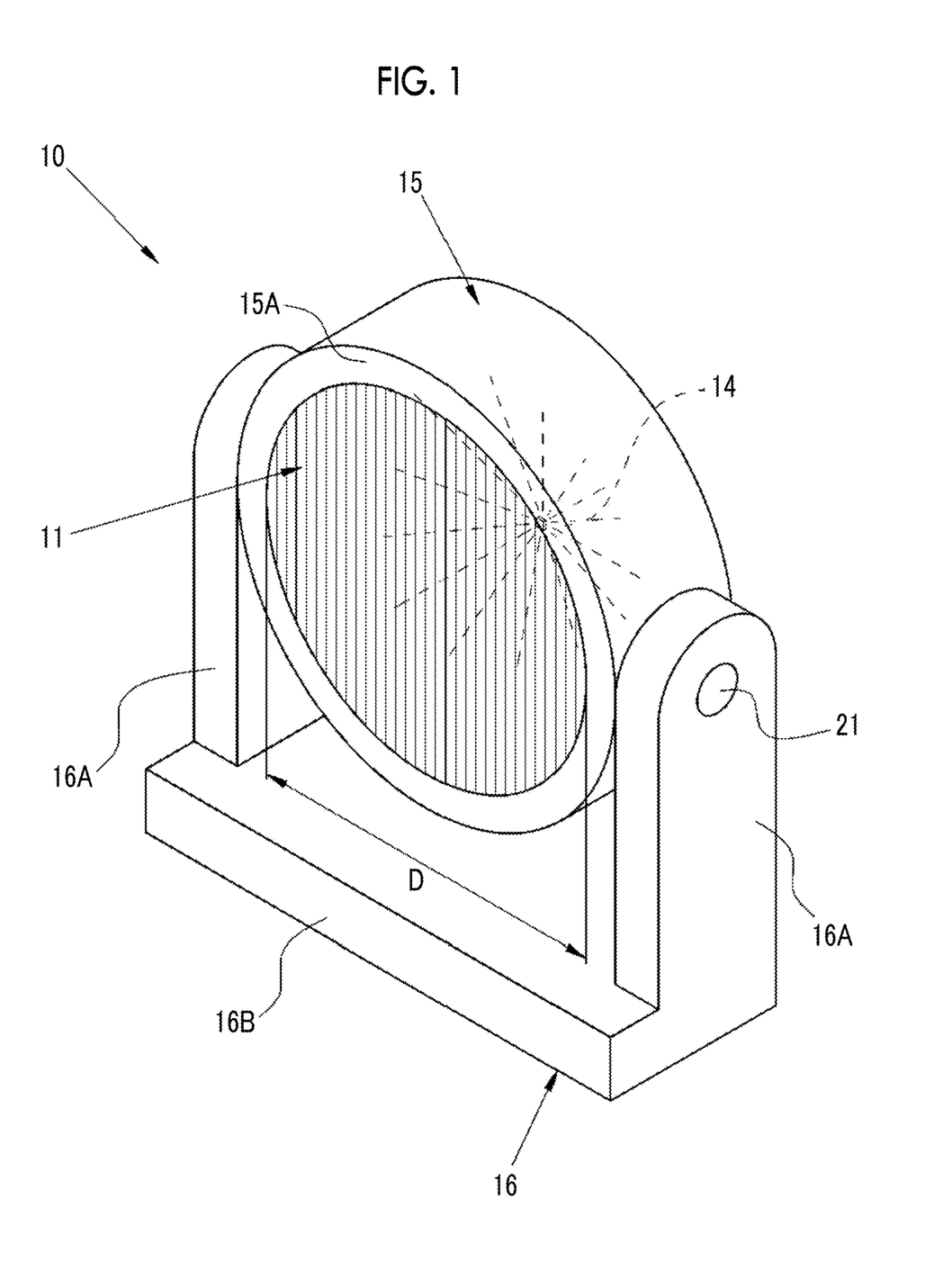
FIG. 1 is a perspective view of an illumination device of the present invention in front view.
Figure 2:
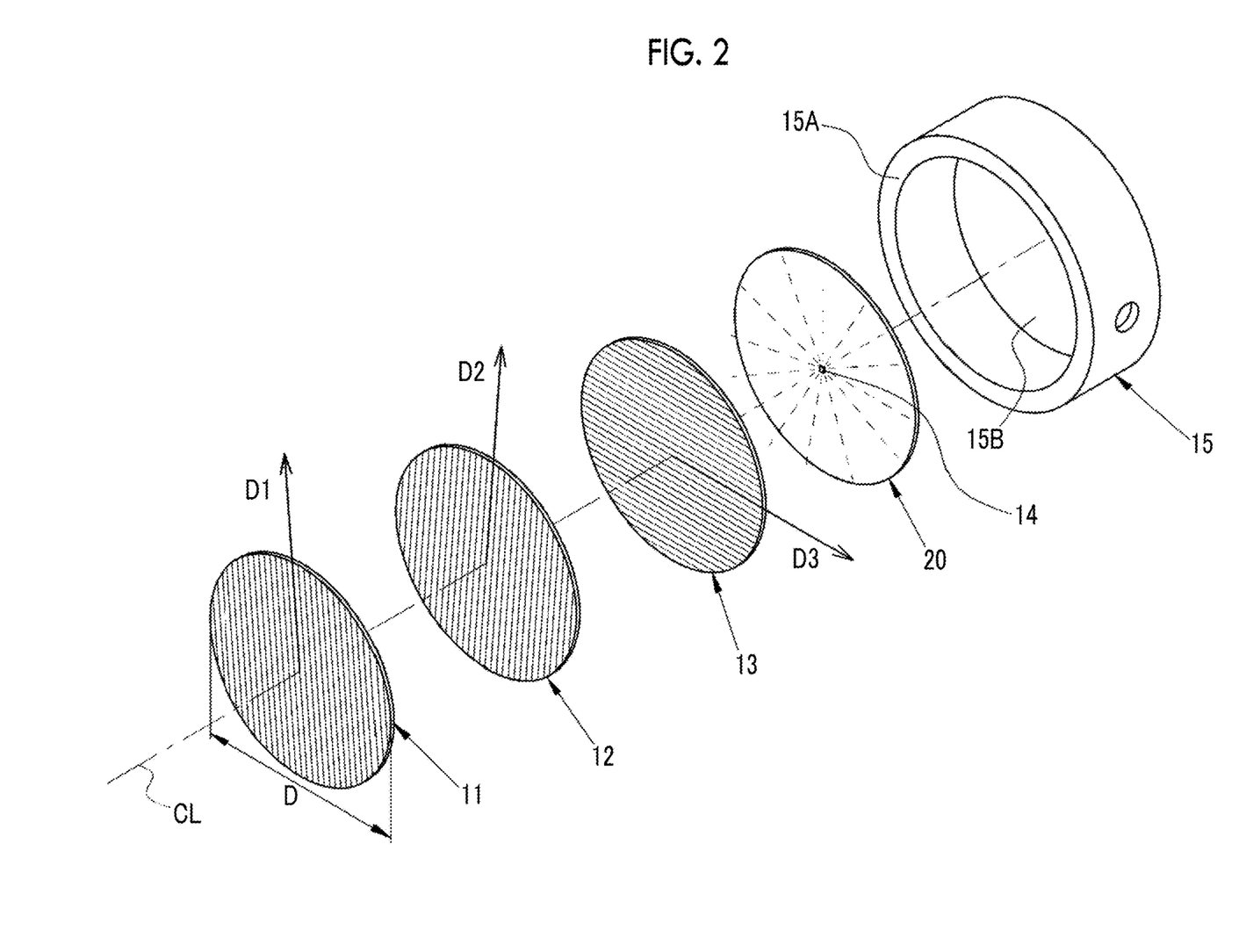
FIG. 2 is an exploded perspective view of the illumination device.

In FIGS. 1 and 2, an illumination device 10 includes first to third lenticular lens sheets 11 to 13, one LED light source 14, a casing 15, and a leg portion 16. The first to third lenticular lens sheets 11 to 13 have circular shapes, and have the same diameter D. The first to third lenticular lens sheets 11 to 13 are laminated.

The casing 15 is a support member that supports the first to third lenticular lens sheets 11 to 13 and the LED light source 14, and includes a cylindrical portion 15A and a rear surface portion 15B. The cylindrical portion 15A has a cylindrical shape, and supports outer peripheral surfaces of the first to third lenticular lens sheets 11 to 13. A central axis CL of the cylindrical portion 15A passes through centers of the first to third lenticular lens sheets 11 to 13. The first to third lenticular lens sheets 11 to 13 are arranged in order on a front surface of the cylindrical portion 15A. The first lenticular lens sheet 11 located in the frontmost position is exposed to the front surface of the illumination device 10. A rear surface of the cylindrical portion 15A is blocked by the rear surface portion 15B.

The LED light source 14 is provided on a substrate 20, and emits, for example, white light rays. The LED light source 14 is arranged as a light source of the illumination device 10 on the central axis CL of the cylindrical portion 15A. The substrate 20 is fixed to the rear surface portion 15B of the casing 15. The LED light source 14 is a so-called point light source of which a chip-like element portion emits light rays and a central portion emits strong light rays. A power supply unit (not shown) such as a battery that supplies power to the LED light source 14 is built in the casing 15.

The LED light source 14 emits illumination light rays through the first to third lenticular lens sheets 11 to 13.

The leg portion 16 includes support portions 16A and a bottom portion 16B. The support portions 16A are arranged on both side portions of the casing 15, and are coupled to the casing 15 so as to rotate through hinge portions 21. The bottom portion 16B is arranged on a bottom surface of the support portions 16A, and a bottom surface is formed in a flat shape. For example, the illumination device 10 is provided on a floor or a table in a room such that the bottom portion 16B faces downwards and the first lenticular lens sheet 11 faces an observer. The illumination device 10 may change the orientation of the illumination light rays by rotating the casing 15 with respect to the leg portion 16 with the hinge portions 21 as a center.

Figure 3:
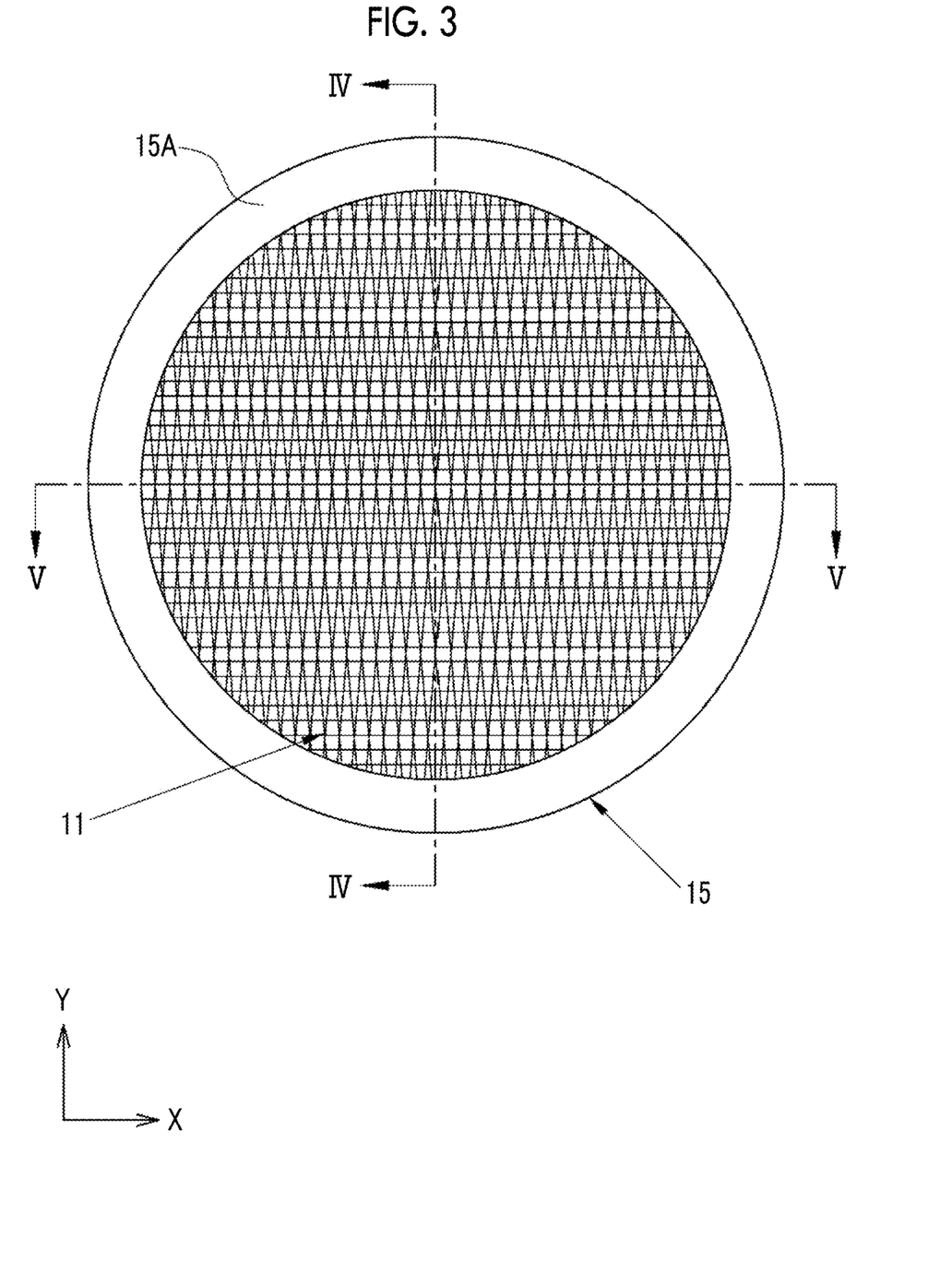
FIG. 3 is a front view of the illumination device.
Figure 4:
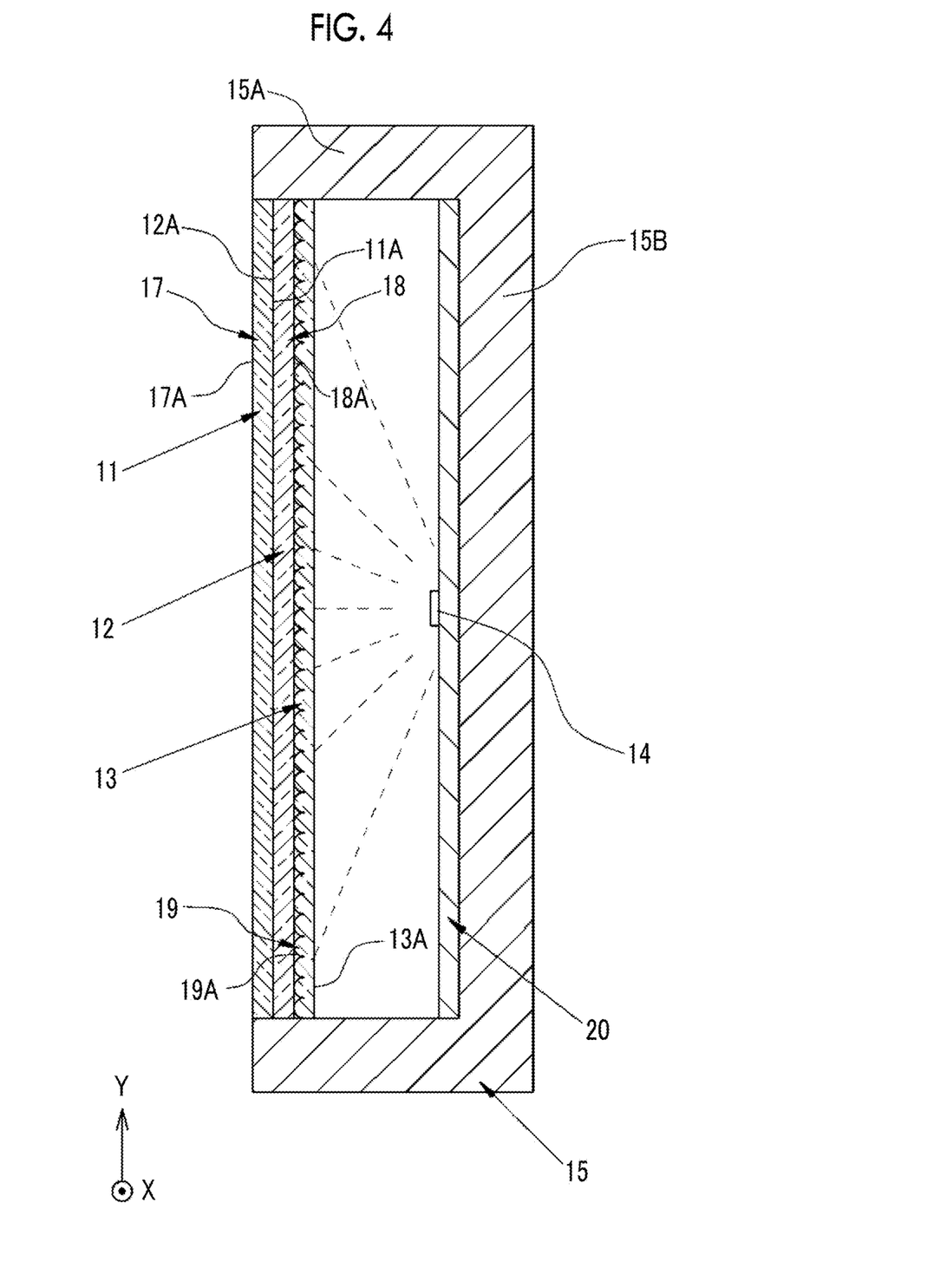
FIG. 4 is a cross-sectional view taken along line IV-IV of FIG. 3.
Figure 5:
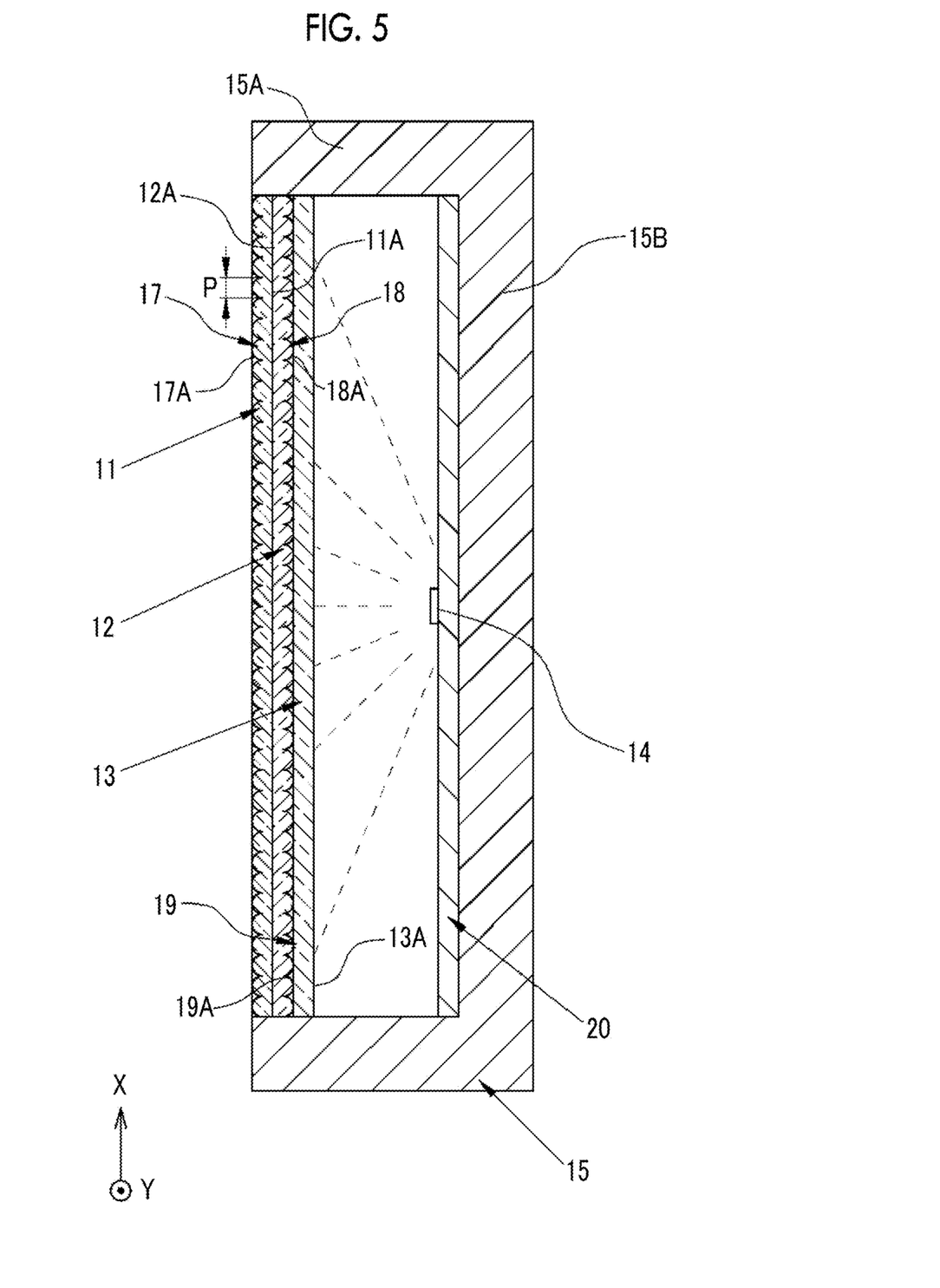
FIG. 5 is a cross-sectional view taken along line V-V of FIG. 3.

As shown in FIGS. 3 to 5, the first lenticular lens sheet 11 includes a plurality of first plano-convex cylindrical lenses 17. In FIGS. 3 to 5, the leg portion 16 is not shown. Each first plano-convex cylindrical lens 17 has a semi-cylindrical convex portion 17A, and has a flat shape on a side opposite to the convex portion 17A. Each first plano-convex cylindrical lens 17 extends in a D1 direction (first direction), and a plurality of first plano-convex cylindrical lenses 17 is arranged such that adjacent first plano-convex cylindrical lenses are parallel to each other. Specifically, the first plano-convex cylindrical lenses 17 are arranged in a direction perpendicular to the D1 direction at a regular pitch P (see FIGS. 5 and 6) with no space therebetween. That is, a width of the first plano-convex cylindrical lens 17 in the direction perpendicular to the D1 direction is equal to the pitch P. The first lenticular lens sheet 11 has a flat surface 11A on a side opposite to the convex portion 17A.

The second lenticular lens sheet 12 is laminated in contact with the first lenticular lens sheet 11. Similarly to the first lenticular lens sheet 11, the second lenticular lens sheet 12 includes a plurality of second plano-convex cylindrical lenses 18. The second plano-convex cylindrical lenses 18 extend in a D2 direction (second direction) and are arranged in a direction perpendicular to the D2 direction at a regular pitch P with no space therebetween. That is, a width of the second plano-convex cylindrical lens 18 in the direction perpendicular to the D2 direction is equal to the pitch P.

The second lenticular lens sheet 12 has a flat surface 12A on a side opposite to a convex portion 18A of the second plano-convex cylindrical lens 18. The first and second lenticular lens sheets 11 and 12 are laminated such that the flat surfaces 11A and 12A are in contact with each other.

The third lenticular lens sheet 13 is arranged on a side of the first and second lenticular lens sheets 11 and 12 facing the LED light source 14. Similarly to the first and second lenticular lens sheets 11 and 12, the third lenticular lens sheet 13 includes a plurality of third plano-convex cylindrical lenses 19. The third plano-convex cylindrical lenses 19 extend in a D3 direction (third direction), and are arranged in a direction perpendicular to the D3 direction at a regular pitch P with no space. That is, a width of the third plano-convex cylindrical lens 19 in the direction perpendicular to the D3 direction is equal to the pitch P.

The third lenticular lens sheet 13 has a flat surface 13A on a side opposite to a convex portion 19A of the third plano-convex cylindrical lens 19. The second and third lenticular lens sheets 12 and 13 are laminated in contact with the convex portions 18A and 19A.

In the present embodiment, all the first to third plano-convex cylindrical lenses 17 to 19 have the same shape, and are arranged at the same pitch P with no space therebetween. All the widths of the first to third plano-convex cylindrical lenses 17 to 19 are the same.

Figure 6:
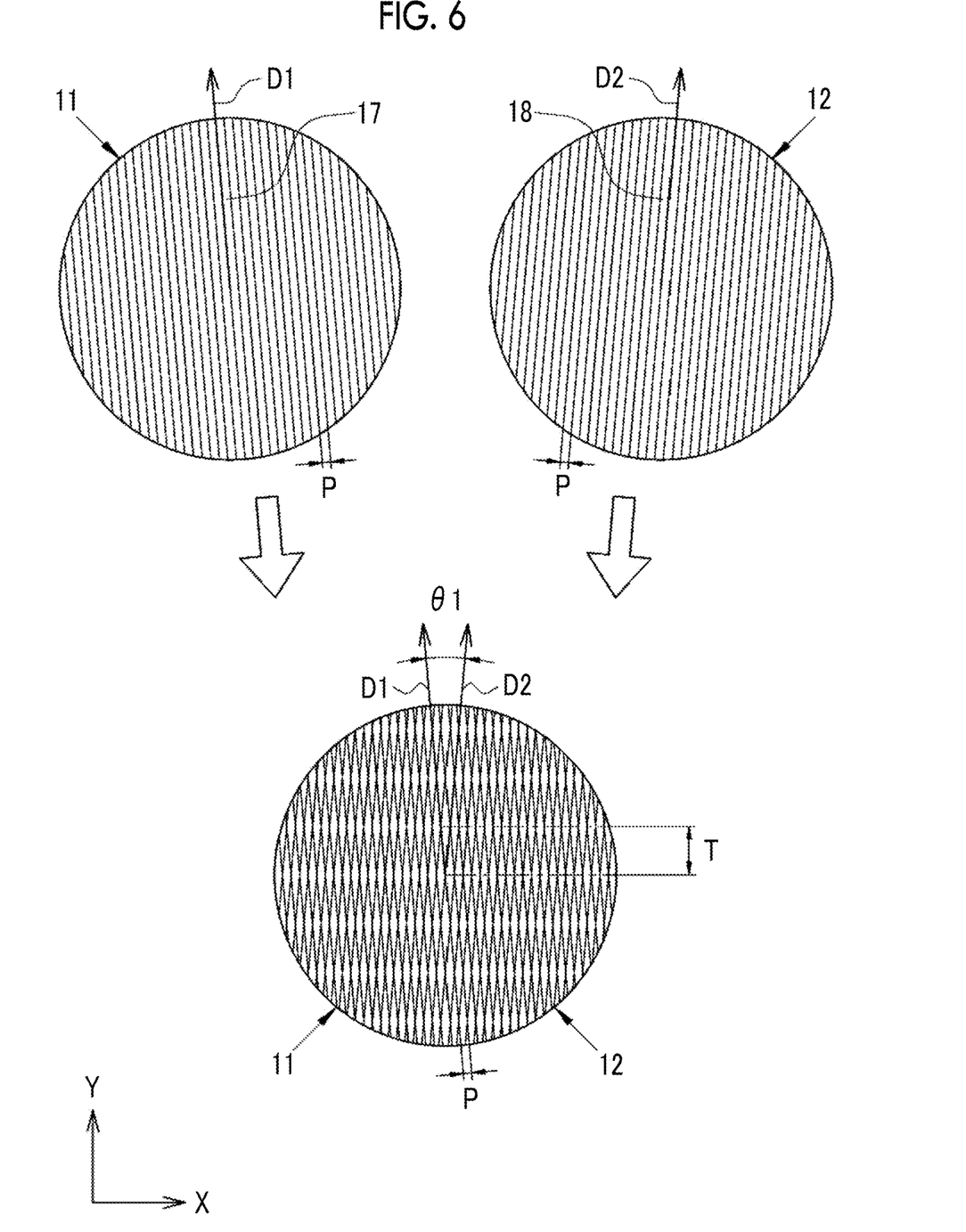
FIG. 6 is an explanatory diagram for describing rotation moire appearing due to first and second lenticular lens sheets.
Figure 7:
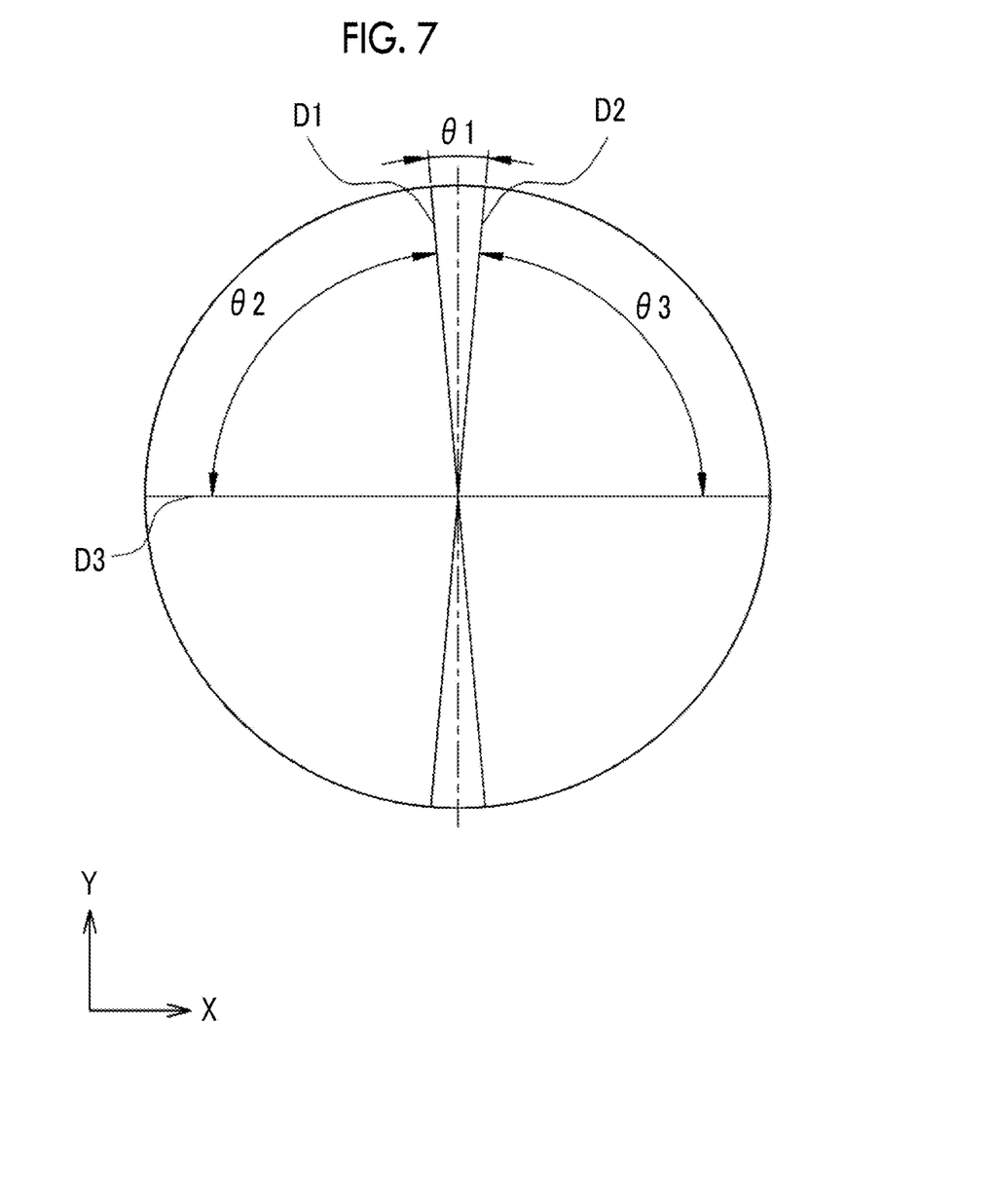
FIG. 7 is an explanatory diagram showing an angle position relationship between first to third plano-convex cylindrical lenses.

In FIG. 6, the second lenticular lens sheet 12 is laminated on the first lenticular lens sheet 11 such that an angle $\theta 1$ ($0° \leq \theta 1 \leq 90°$) formed by the D1 direction and the D2 direction falls within a first angle range. As shown in FIG. 7, the first and second lenticular lens sheets 11 and 12 are arranged such that a bisector in the D1 direction and the D2 direction is parallel to a Y direction. The Y direction is perpendicular to an X direction.

The first angle range is an angle range in which rotation moire appears by the first and second lenticular lens sheets 11 and 12. The rotation moire is a streak pattern (moire fringes) observed in a case where streak patterns regularly arranged as in the lenticular lens sheets are laminated such that one pattern is rotated around the other pattern. The moire fringes appear along a direction (X direction) which is substantially perpendicular to the D1 direction and the D2 direction. A cycle T of the moire fringe is acquired by Expression (1) using the pitch P and the angle $\theta 1$.

$$T = P/\tan \theta 1 \quad (1)$$

In principle, the moire fringes appear from Expression (1) in a case where the angle $\theta 1$ is greater than 0°. Thus, a lower limit αcmin of the first angle range which is the angle range in which the rotation moire appears may be greater than at least 0° ($\alpha_{min}$>0). More specifically, since the cycle T of the moire fringe becomes larger as the angle θ1 becomes smaller, in a case where the angle θ1 is extremely small, the cycle T is greater than the size (diameter D) of the first and second lenticular lens sheets 11 and 12, and the moire fringes do not appear. Thus, the lower limit $\alpha_{min}$ of the first angle range needs to be an angle that satisfies the relationship of "D>T". Accordingly, the lower limit $\alpha_{min}$ is expressed by Expression (2).

$$\alpha min = a \tan(P/D) \qquad (2)$$

Meanwhile, since the cycle T of the moire fringe becomes smaller as the angle θ1 becomes larger, in a case where the angle θ1 is extremely large, an interval between the moire fringes is narrow, and the streaks are integrated. As a result, the moire fringes are not able to be visually perceived. In the present embodiment, in a case where the pitch P is about 0.01 mm and the angle θ1 is equal to or greater than about 30°, the moire fringes are not able to be visually perceived. Accordingly, an upper limit $\alpha_{max}$ of the first angle range is about 30°.

That is, it is preferable that the first angle range is a range which is greater than 0° and is less than 30°, and it is preferable that the lower limit $\alpha_{min}$ of the first angle range is a value calculated by Expression (2).

As shown in FIG. 7, the third lenticular lens sheet 13 is laminated on the first and second lenticular lens sheets 11 and 12 such that both an angle θ2 (0°≤θ2≤90°) formed by the D1 direction and the D3 direction and an angle θ3 (0°≤θ3≤90°) formed by the D2 direction and the D3 direction fall within a second angle range. The third lenticular lens sheet 13 is arranged such that the D3 direction is parallel to the Y direction.

The second angle range is an angle range in which the rotation moire does not appear by two lenticular lens sheets. That is, the second angle range is out of the first angle range, and is, for example, an angle range which is equal to or greater than 30° and is equal to or less than 90°. A lower limit of the second angle range is greater than the upper limit of the first angle range. That is, moire does not appear between the third lenticular lens sheet 13 and the first and second lenticular lens sheets 11 and 12.

Figure 8:
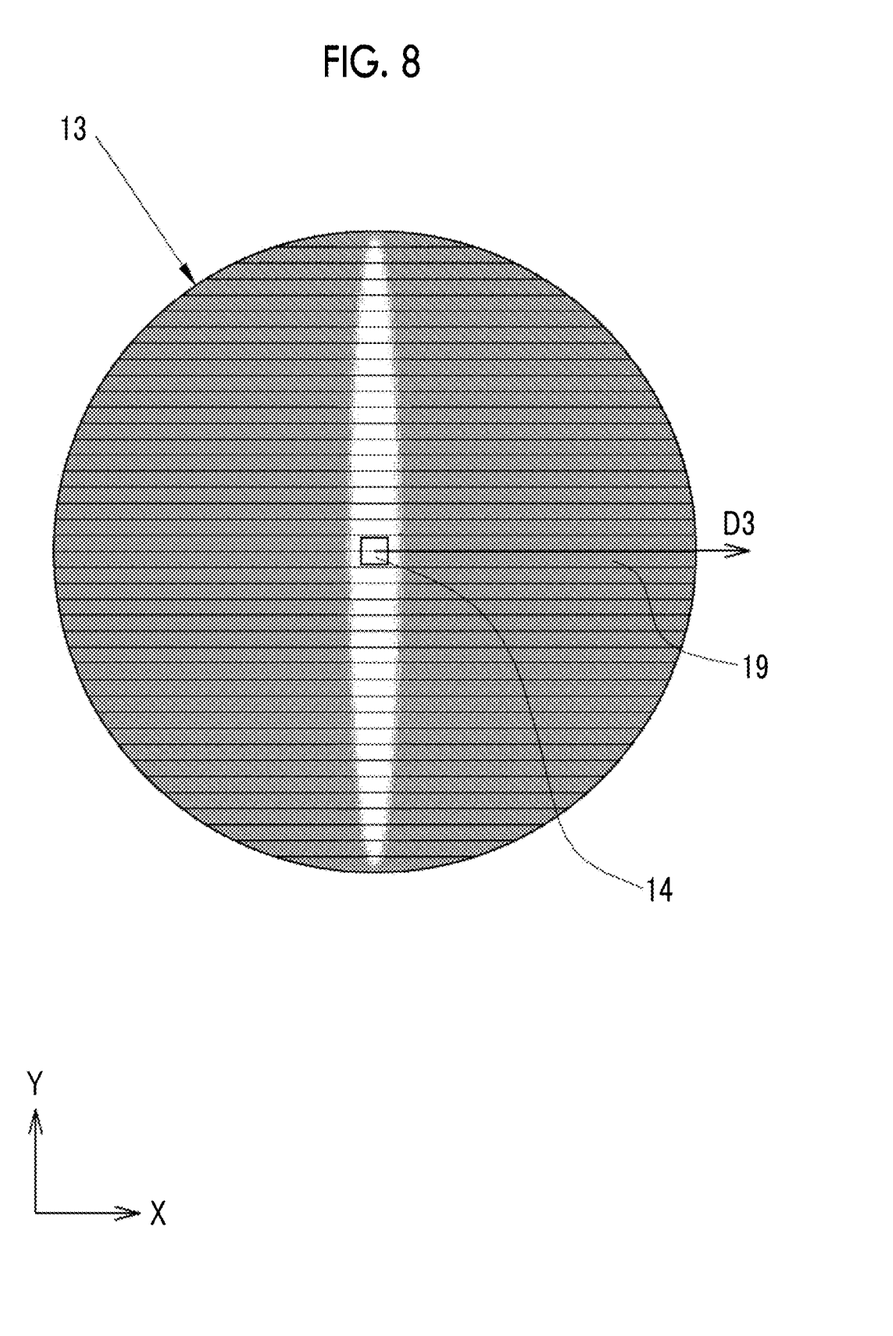
FIG. 8 is an explanatory diagram for describing an action of a third lenticular lens sheet.

As shown in FIG. 8, the third lenticular lens sheet 13 has a function of diffusing the light rays emitted from the LED light source 14 in a direction (Y direction) perpendicular to the D3 direction. This is because the third plano-convex cylindrical lenses 19 diffuse and emit the light rays in the direction perpendicular to the D3 direction through a lens effect. That is, the third lenticular lens sheet 13 has a function of rendering point-shaped illumination light rays emitted from the LED light source 14 to line-shaped illumination light rays extending in the Y direction.

The first lenticular lens sheet 11 has a function of diffusing the light rays in the direction perpendicular to the D1 direction through the lens effect, and the second lenticular lens sheet 12 has a function of diffusing the light rays in the direction perpendicular to the D2 direction through the lens effect. That is, the first and second lenticular lens sheets 11 and 12 have functions of diffusing the light rays in the direction (X direction) which are substantially perpendicular to the D1 direction and the D2 direction, and the moire fringes appear along the X direction.

Figure 9:
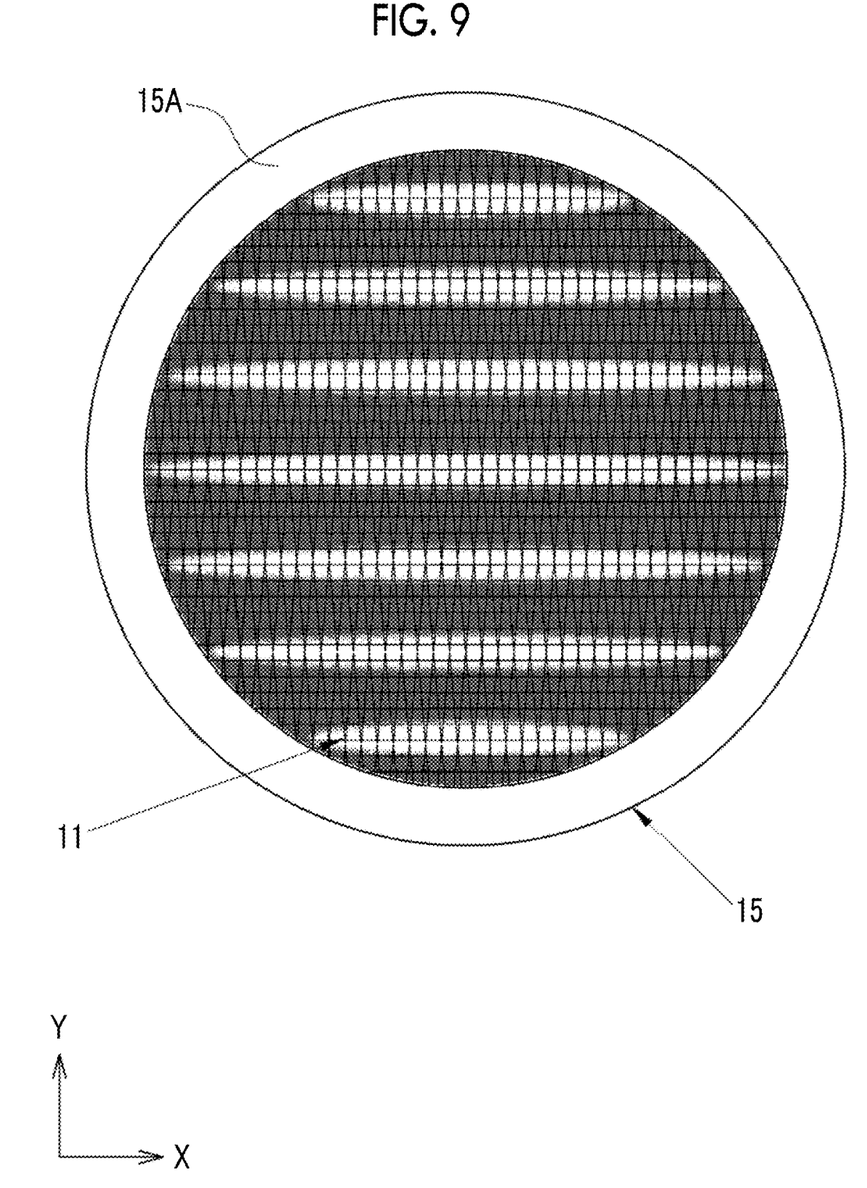
FIG. 9 is an explanatory diagram showing an emission state of the illumination device.

Accordingly, the first and second lenticular lens sheets 11 and 12 diffuse the line-shaped illumination light rays extending in the Y direction in the X direction by the third lenticular lens sheet 13. In this case, since the moire fringes appear along the X direction which is the same direction as the diffusion direction of the illumination light rays, the moire fringes having high contrast are displayed by the illumination light rays as shown in FIG. 9.

As stated above, the illumination device 10 can generate the streak illumination light rays by one LED light source 14, and can save power. The illumination device 10 can generate, not the monotonous illumination light rays as in the illumination device of the related art, but the streak illumination light rays having high contrast, and has excellent decorativeness.

Second Embodiment

Figure 10:
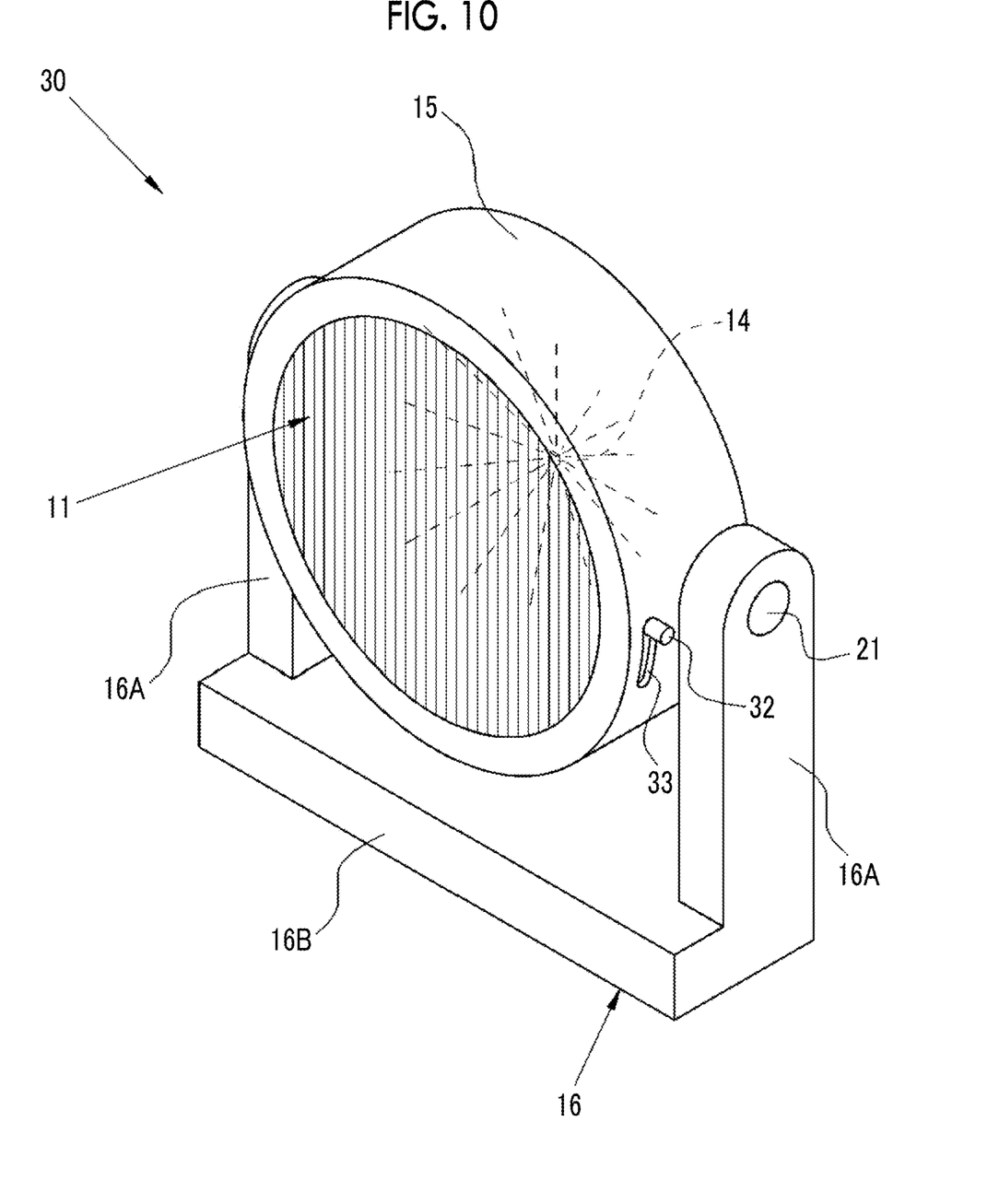
FIG. 10 is a perspective view of an illumination device of a second embodiment in front view.
Figure 11:
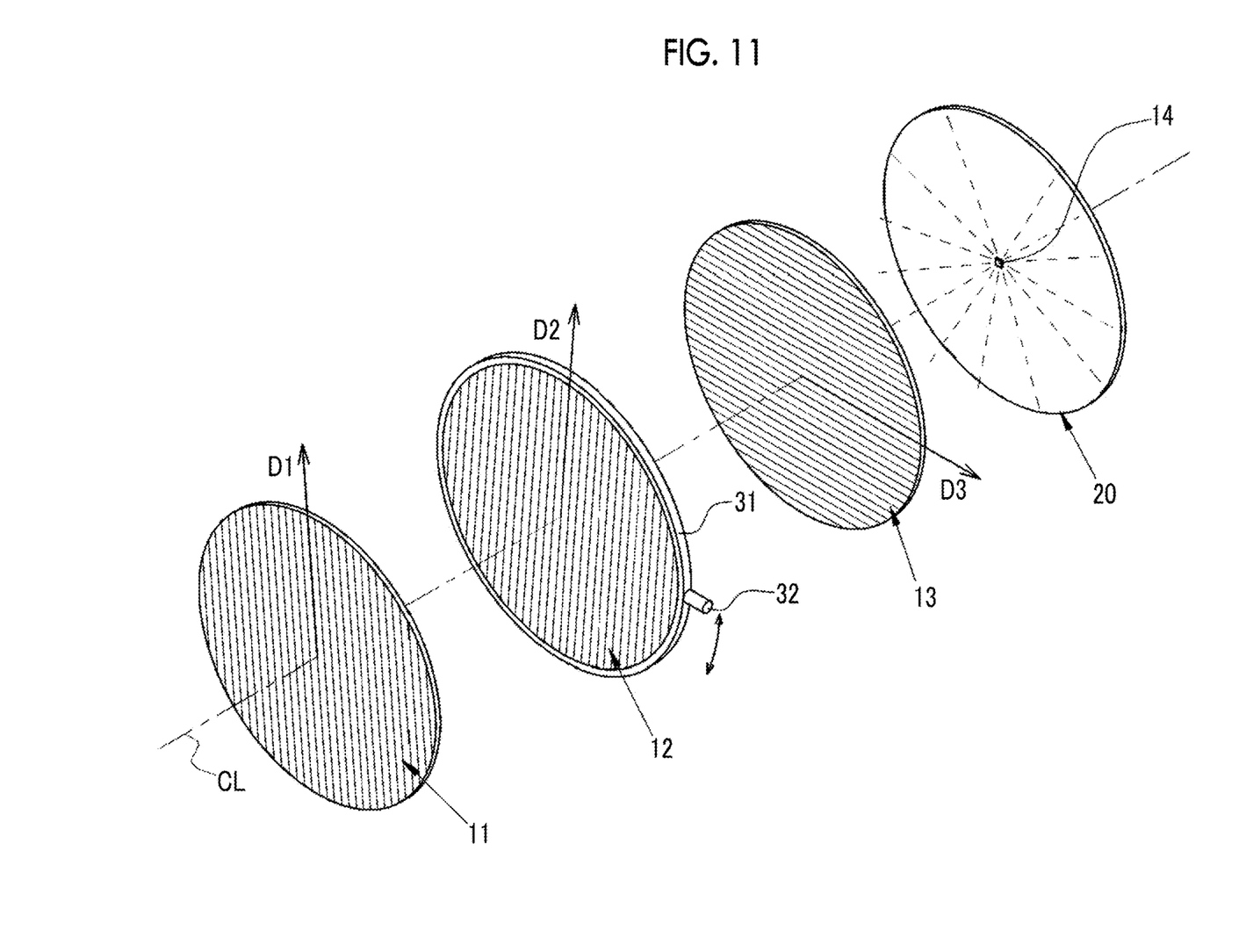
FIG. 11 is an exploded perspective view showing a configuration of the illumination device of the second embodiment.

In FIGS. 10 and 11, in an illumination device 30 of the second embodiment, the second lenticular lens sheet 12 may rotate around the first lenticular lens sheet 11. Another configuration of the illumination device 30 is the same as the configuration of the illumination device 10 of the first embodiment.

The illumination device 30 includes a frame member 31 fixed to the outer peripheral surface of the second lenticular lens sheet 12, and a knob portion 32. The frame member 31 is fit to an inner peripheral surface of the casing 15, and the frame member and the second lenticular lens sheet 12 are held so as to rotate. The knob portion 32 is integrally formed with the frame member 31. The knob portion passes through an opening portion 33 formed in the casing 15 so as to protrude, and is able to be operated from the outside.

With such a configuration, in a case where the second lenticular lens sheet 12 is rotated by operating the knob portion 32, since the angle θ1 is changed, the cycle T of the moire appearing due to the first and second lenticular lens sheets 11 and 12 is changed, and the streak pattern of the illumination light rays is also changed. As stated above, the decorativeness can be changed depending on observer's preference.

Although it has been described in the example shown in FIGS. 10 and 11 that the second lenticular lens sheet 12 is able to manually rotate around the first lenticular lens sheet 11, the present invention is not limited thereto. A rotation mechanism (not shown) that electrically rotates the second lenticular lens sheet 12 may be provided.

Third Embodiment

Figure 12:
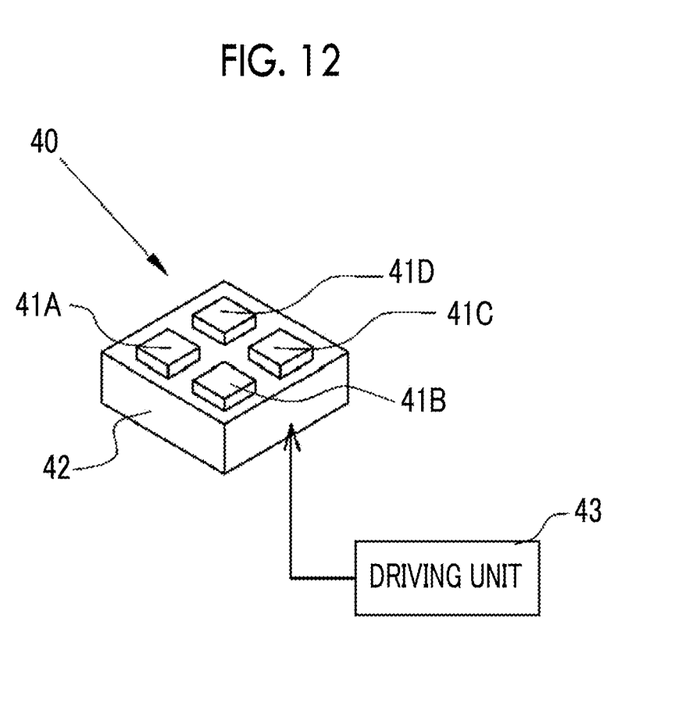
FIG. 12 is a perspective view showing a light source used in an illumination device of a third embodiment.

In the third embodiment, a light source 40 of which color is variable is used instead of the LED light sources 14 of the embodiments, as shown in FIG. 12. The light source 40 has a plurality of LED light sources 41A to 41D of which emission colors are different, and a substrate 42 on which the LED light sources 41A to 41D are formed. For example, red, green, blue, and white LED light sources are used as the LED light sources 41A to 41D. A driving unit 43 is connected to the substrate 42.

The driving unit 43 changes the emission color of the light source 40 by changing the emission states (light emission intensity and duty) of the LED light sources 41A to 41D. Accordingly, it is possible to further increase decorativeness by changing the emission color of the light source 40 depending on a situation.

Fourth Embodiment

Figure 13:
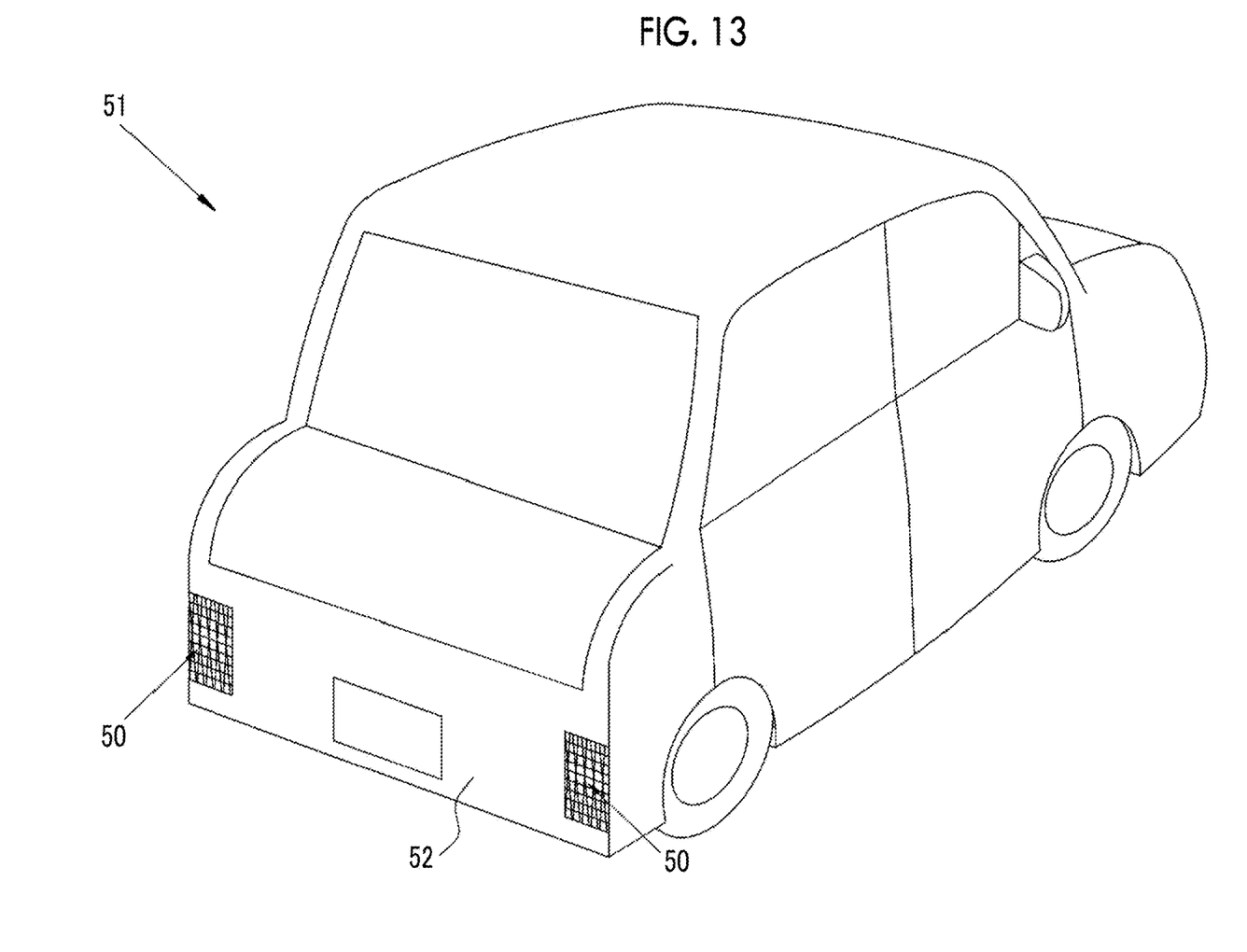
FIG. 13 is a perspective view showing an example in which the present invention is applied to an illumination device of a vehicle.

FIG. 13 shows an example in which an illumination device 50 is attached to a vehicle 51. For example, the illumination device 50 is attached so as to be embedded in a vehicle body 52 of the vehicle 51. The illumination device 50 has the same configuration as any of the illumination devices of the first to third embodiments except that the external appearance of the first to third lenticular lens sheets 11 to 13 has a rectangular shape. For example, the illumination device 50 is attached to a rear part of the vehicle body 52, and is used as a tail lamp. The present invention is not limited thereto, and the illumination device 50 may be applied to a headlamp attached to a front part of the vehicle body 52.

In a case where the illumination device of the second embodiment is attached to the vehicle 51, the streak pattern of the illumination light rays may be changed by rotating the second lenticular lens sheet 12 depending on an operation state (for example, a case where a brake is activated or the like) of the vehicle 51.

Although it has been described in the embodiments that the first to third lenticular lens sheets 11 to 13 are arranged in order on the front surface, this order is not limited. Although it has been described in the embodiments that the first and third lenticular lens sheets 11 and 13 are arranged such that the convex portions 17A and 19A face the front surface and the second lenticular lens sheet 12 is arranged such that the flat surface 12A faces the front surface, the present invention is not limited thereto. Any of the convex portion and the flat surface of each lenticular lens sheet may face the front surface. The first to third lenticular lens sheets 11 to 13 may generate the streak illumination light rays irrespective of the order or the orientation.

Although it has been described in the embodiments that the arrangement pitches and widths of the first to third plano-convex cylindrical lenses 17 to 19 are the same, the present invention is not limited thereto. The arrangement pitches and widths of the first to third plano-convex cylindrical lenses 17 to 19 may be different from one another.

Although it has been described in the embodiments that the first to third lenticular lens sheets 11 to 13 are arranged in contact with one another, the present invention is not limited thereto. The first to third lenticular lens sheets 11 to 13 may be arranged so as to be separated from one another.

Although it has been described in the embodiments that the external appearance of the first to third lenticular lens sheets 11 to 13 has the circular shape or the rectangular shape, the external appearance of the first to third lenticular lens sheets 11 to 13 may have any external shape. Although it has been described in the embodiments that the LED light source is used as the light source, the present invention is not limited thereto. A point light source other than the LED light source may be used. Although it has been described in the embodiments that only one point light source is used, a plurality of point light sources may be used.

Although it has been described in the embodiments that the present invention is applied to the illumination device in the room or the illumination device attached to the interior equipment of the vehicle, the present invention is not limited thereto. The present invention may be applied to an illumination device to be used in commercial facilities such as amusement parks or entertainment machines such as game machines or an illumination device attached to motorcycles.

EXPLANATION OF REFERENCES

10, 20, 30, 50: illumination device
11: first lenticular lens sheet
12: second lenticular lens sheet
13: third lenticular lens sheet
14: LED light source
15: casing (support member)
17: first plano-convex cylindrical lens
18: second plano-convex cylindrical lens
19: third plano-convex cylindrical lens

What is claimed is:
1. An illumination device comprising:
a first lenticular lens sheet in which a plurality of first plano-convex cylindrical lenses which extends in a first direction is arranged in a direction perpendicular to the first direction;
a second lenticular lens sheet in which a plurality of second plano-convex cylindrical lenses which extends in a second direction is arranged in a direction perpendicular to the second direction;
a third lenticular lens sheet in which a plurality of third plano-convex cylindrical lenses which extends in a third direction is arranged in a direction perpendicular to the third direction; and
at least one point light source that emits illumination light rays through the first to third lenticular lens sheets,
wherein the second lenticular lens sheet is laminated on the first lenticular lens sheet such that an angle formed by the first direction and the second direction falls within a first angle range,
the third lenticular lens sheet is laminated on the first and second lenticular lens sheets such that each of an angle formed by the first direction and the third direction and an angle formed by the second direction and the third direction falls within a second angle range,
a lower limit of the second angle range is greater than an upper limit of the first angle range,
the third lenticular lens sheet renders point-shaped illumination light rays emitted from the point light source to line-shaped illumination light rays extending in a direction perpendicular to the third direction, and
the first and second lenticular lens sheets diffuse the line-shaped illumination light rays extending in the direction perpendicular to the third direction by the third lenticular lens sheet in a direction substantially perpendicular to the first direction and the second direction, to generate streak illumination light rays along a diffusion direction of the illumination light rays diffused by the first and second lenticular lens sheets.
2. The illumination device according to claim 1,
wherein the first angle range is an angle range in which rotation moire appears by the first and second lenticular lens sheets.
3. The illumination device according to claim 2,
wherein the first angle range is a range which is greater than 0 degrees and is less than 30 degrees.
4. The illumination device according to claim 1,
wherein the first and second lenticular lens sheets are laminated in contact with each other, and
the third lenticular lens sheet is arranged on a side of the first and second lenticular lens sheets facing the point light source or on a side of the first and second lenticular lens sheets opposite to the point light source.
5. The illumination device according to claim 4,
wherein the first and second lenticular lens sheets are laminated such that flat surfaces are in contact with each other.
6. The illumination device according to claim 1,
wherein the second lenticular lens sheet is held so as to rotate with respect to the first lenticular lens sheet.

7. The illumination device according to claim 1, further comprising:
a support member that supports the point light source and the first to third lenticular lens sheets.

8. The illumination device according to claim 7, wherein the support member has a cylindrical shape, and the point light source is arranged on a central axis of the support member.

9. The illumination device according to claim 8, wherein the first to third lenticular lens sheets have circular shapes, and
wherein a diameter of the circle is D and arrangement pitches of the first and second plano-convex cylindrical lenses are P, a lower limit of the first angle range is $\alpha_{min}$ calculated by $\alpha_{min}=\operatorname{atan}(P/D)$.

10. The illumination device according to claim 1, wherein color of the point light source is variable.

11. The illumination device according to claim 1, wherein the point light source is an LED light source.

* * * * *